United States Patent
Xu

(10) Patent No.: US 10,134,641 B2
(45) Date of Patent: Nov. 20, 2018

(54) ENHANCED INTEGRATION OF DMOS AND CMOS SEMICONDUCTOR DEVICES

(71) Applicant: CoolStar Technology, Inc., Sunnyvale, CA (US)

(72) Inventor: Shuming Xu, Sunnyvale, CA (US)

(73) Assignee: COOLSTAR TECHNOLOGY, INC., Sunnyvale, CA (US)

( * ) Notice: Subject to any disclaimer, the term of this patent is extended or adjusted under 35 U.S.C. 154(b) by 0 days.

(21) Appl. No.: 15/015,956

(22) Filed: Feb. 4, 2016

(65) Prior Publication Data

US 2016/0343712 A1  Nov. 24, 2016

Related U.S. Application Data

(60) Provisional application No. 62/165,094, filed on May 21, 2015.

(51) Int. Cl.
*H01L 29/66* (2006.01)
*H01L 29/78* (2006.01)
(Continued)

(52) U.S. Cl.
CPC ........ *H01L 21/823835* (2013.01); *H01L 21/28097* (2013.01); *H01L 21/823842* (2013.01); *H01L 27/0922* (2013.01); *H01L 29/4975* (2013.01); *H01L 29/66507* (2013.01); *H01L 29/66659* (2013.01); *H01L 29/7835* (2013.01); *H01L 21/82345* (2013.01); *H01L 21/823418* (2013.01); *H01L 21/823443* (2013.01); *H01L 29/402* (2013.01)

(58) Field of Classification Search
CPC ......... H01L 21/8234; H01L 21/823835; H01L 21/28097; H01L 21/823842; H01L 27/0922; H01L 29/66; H01L 29/78; H01L 29/4975; H01L 29/666507; H01L 29/66659; H01L 29/7835
See application file for complete search history.

(56) References Cited

U.S. PATENT DOCUMENTS 4,788,663 A   11/1988   Tanaka et al.
5,874,329 A   2/1999    Neary et al.
(Continued)

OTHER PUBLICATIONS

Paul Coteus, "Power Systems for Current and Future High Performance Computers," IEEE Proc. of the 26th Int'l Symp. on Power Semiconductor Dev. & IC's, Jun. 2014, pp. 1-5.
(Continued)

*Primary Examiner* — Fazli Erdem
(74) *Attorney, Agent, or Firm* — Hoffmann & Baron, LLP

(57) ABSTRACT

A method of fabricating a power semiconductor device includes: forming at least one lateral diffused metal-oxide-semiconductor (LDMOS) structure having a first fully silicided gate including a first metal silicide material; and forming at least one complementary metal-oxide-semiconductor (CMOS) structure integrated with the LDMOS structure on a same substrate, the CMOS structure having a second fully silicided gate including a second metal silicide material. The first metal silicide material preferably includes tungsten silicide and the second metal silicide material includes a material other than tungsten silicide.

27 Claims, 4 Drawing Sheets

(51) Int. Cl.
*H01L 21/8238* (2006.01)
*H01L 29/49* (2006.01)
*H01L 21/28* (2006.01)
*H01L 27/092* (2006.01)
*H01L 29/40* (2006.01)
*H01L 21/8234* (2006.01)

(56) References Cited

U.S. PATENT DOCUMENTS

| | | | |
|---|---|---|---|
| 6,432,768 B1* | 8/2002 | Chien | H01L 27/10894 257/E21.438 |
| 2002/0056872 A1 | 5/2002 | Baliga | |
| 2004/0229438 A1* | 11/2004 | Moscatelli | H01L 21/82381 438/275 |
| 2005/0106825 A1* | 5/2005 | You | H01L 21/823814 438/301 |
| 2005/0167756 A1* | 8/2005 | Lotfi | H01L 21/761 257/369 |
| 2008/0246086 A1* | 10/2008 | Korec | H01L 29/41741 257/343 |
| 2010/0052052 A1 | 3/2010 | Lotfi et al. | |
| 2010/0155836 A1* | 6/2010 | Hebert | H01L 21/823487 257/334 |
| 2011/0183507 A1 | 7/2011 | Figura et al. | |
| 2013/0264640 A1* | 10/2013 | Salman | H01L 29/66659 257/343 |
| 2014/0035032 A1* | 2/2014 | Korec | H01L 21/8234 257/337 |
| 2014/0057405 A1* | 2/2014 | Zhou | H01L 29/7816 438/286 |
| 2014/0131796 A1* | 5/2014 | Zhou | H01L 29/66681 257/336 |
| 2014/0159153 A1* | 6/2014 | Qian | H01L 29/4983 257/343 |
| 2014/0191317 A1* | 7/2014 | Qian | H01L 21/265 257/339 |
| 2015/0340448 A1* | 11/2015 | Babcock | H01L 27/0623 257/340 |

OTHER PUBLICATIONS

S.P. Murarka, "Refractory Silicides for Integrated Circuits," J. Vac. Sci. Technol., 17(4), Jul./Aug. 1908, pp. 775-792.

Krishna Shenai, "Gate-Resistance-Limited Switching Frequencies of Power MOSFET's," IEEE Electron Device Letters, vol. 11, No. 11, Nov. 1990, pp. 544-546.

International Search Report & Written Opinion issued in counterpart Int'l. Appln. No. PCT/US16/33230 dated Aug. 23, 2016.

R.W. Mann et al., "Silicides and Local Interconnections for High-Performance VLSI Applications," IBM J. Res. Develop., Jul. 1995, pp. 403-447, vol. 39, No. 4.

S.W. Crowder et al., "The Effect of Source/Drain Processing on the Reverse Short Channel Effect of Deep Sub-Micron Bulk and SOI NMOSFETs," IEEE IEDM95, 1995, pp. 17.4.1-17.4.4.

M-L Chen, "Self-Aligned Silicided Inverse-T Gate LDD Devices for Sub-Half Micron CMOS Technology," IEEE IEDM90, 1990, pp. 33.4.1-33.4.4.

Li Zhang et al., "Insight into the S/D Engineering by High-resolution Imaging and Precise Probing of 2D-Carrier Profiles with Scanning Spreading Resistance Microscopy," IEEE IEDM09, 2009, pp. 2.4.1-2.4.4.

J.E. Moon et al., "A New LDD Structure: Total Overlap with Polysilicon Spacer (TOPS)," IEEE Electron Device Letters, May 1990, pp. 221-223, vol. 11, No. 5.

"International Technology Roadmap for Semiconductors," 2011 Ed., Process Integration, Devices, and Structures, pp. 1-41.

Jianxin Lei, "Advances in Salicide Metallization for the 32/22nm Node CMOS Technology," Metal Deposition Products (CPI), Silicon Systems Group, Applied Materials, Oct. 2007, pp. 1-27.

* cited by examiner

ENHANCED INTEGRATION OF DMOS AND CMOS SEMICONDUCTOR DEVICES

CROSS-REFERENCE TO RELATED APPLICATIONS

This patent application claims the benefit of U.S. Provisional Patent Application Ser. No. 62/165,094 filed on May 21, 2015, entitled "Architectures for Integrated CMOS-DMOS Devices," the complete disclosure of which is expressly incorporated herein by reference in its entirety for all purposes.

FIELD

The present invention relates generally to integrated circuit (IC) structures, and more particularly to semiconductor structures and methods for integrating high-speed complementary metal-oxide-semiconductor (CMOS) devices with high-speed double-diffused metal-oxide-semiconductor (DMOS) devices.

BACKGROUND

Radio frequency power amplifiers (RF PAs) are essential for use in mobile devices, such as, but not limited to, smartphones, mobile computing devices (e.g., tablet computers), and other applications. The modern trend is for RF PAs with higher efficiencies, smaller form factors, and lower manufacturing costs.

An RF PA based on standard CMOS technologies often exhibits poor performance, due at least in part to low efficiency, low breakdown voltage and poor linearity, among other factors, thus limiting its application. Known techniques for improving the performance of CMOS-based RF PAs have been largely unsuccessful. For example, in attempting to increase the voltage capability of a CMOS-based RF PA, cascading techniques have been employed, which generally involves stacking multiple N-channel metal-oxide-semiconductor (NMOS) devices together to thereby distribute the supply voltage across the multiple devices. However, controlling the multiple gates of these stacked devices simultaneously requires a complex gate bias network, which is often highly sensitive to variations in process, voltage and/or temperature (PVT) conditions to which the device is subjected. Furthermore, the stacked NMOS devices may cause an increase in channel resistance and a decrease in transconductance, which is undesirable. To compensate for the lower transconductance of the cascaded NMOS device arrangement, large-area devices can be used. However, this comes at the expense of increased junction capacitance, which deteriorates the high-frequency capability of the RF PA.

SUMMARY

One or more embodiments of the present invention provide enhanced techniques for integrating CMOS and DMOS devices on the same substrate. Aspects of the invention beneficially exploit the use of DMOS-based devices for their superior high-voltage capability and, through novel process techniques and/or structures, achieve high-frequency performance, among other advantages, which enables such DMOS devices to be integrated with prevalent CMOS-based logic control devices to attain a combination of superior high-frequency performance and control functions that is unmatched by discrete DMOS devices and CMOS circuitry fabricated on different silicon dies. More particularly, embodiments of the present invention facilitate the fabrication of high-speed (e.g., several GHz and above) DMOS devices which exhibit high breakdown voltage, low figure of merit (FOM), low drain-source on-resistance ($R_{Ds,on}$), and high drain current ($I_{Dlin}$), among other benefits. The novel DMOS process according to embodiments of the invention is compatible with standard CMOS process technology, thereby enabling CMOS control circuits and the like to be easily integrated with such DMOS devices on the same silicon substrate to further achieve superior performance (e.g., by reducing parasitic impedance, such as driving loop inductance and resistance) over discrete DMOS and CMOS components, without necessitating a change in the CMOS device structure or fabrication process.

In accordance with one embodiment, a method of fabricating a power semiconductor device includes: forming at least one lateral diffused metal-oxide-semiconductor (LDMOS) structure having a first fully silicided gate including a first metal silicide material; and forming at least one CMOS structure integrated with the LDMOS structure on the same substrate, the CMOS structure having a second fully silicided gate including a second metal silicide material. In one or more embodiments, the first gate of the LDMOS structure includes tungsten silicide.

In accordance with another embodiment, a power semiconductor device includes: at least one LDMOS structure having a first fully silicided gate including a first metal silicide material; and at least one CMOS structure integrated with the LDMOS structure on the same substrate, the CMOS structure having a second fully silicided gate including a second metal silicide material. In one or more embodiments, the first gate of the LDMOS structure includes tungsten silicide.

Techniques according to embodiments of the present invention provide substantial beneficial technical effects. By way of example only and without limitation, one or more embodiments provide a DMOS device having one or more of the following advantages, among other benefits:

superior figure of merit (FOM) attributable primarily to low total gate charge, $Q_g$, and low drain-source on-resistance, $R_{Ds,on}$;
high drain current, $I_{Dlin}$;
high-frequency performance of about 5 GHz or higher;
readily integratable with mainstream CMOS process technology.

These and other features and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

Figure 1:
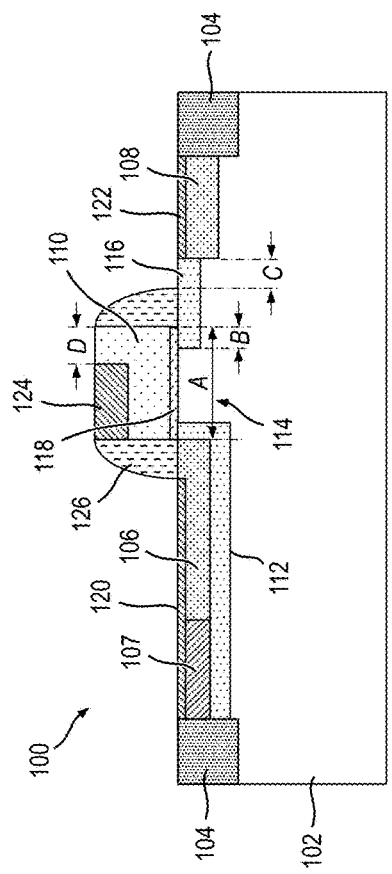
FIG. 1 is a cross-sectional view depicting at least a portion of an exemplary semiconductor structure including a laterally diffused metal-oxide-semiconductor (LDMOS) transistor device.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of radio frequency power amplifiers (RF PAs) utilizing illustrative semiconductor structures and fabrication methods for integrating high-speed power DMOS and CMOS technologies on the same substrate. It is to be appreciated, however, that the invention is not limited to the specific methods and/or devices illustratively shown and described herein. Rather, aspects of the present disclosure relate more broadly to techniques for forming DMOS semiconductor structures designed to exploit the superior high-frequency and high-voltage performance benefits of standard DMOS-based technologies in such a manner that the DMOS structures can be readily integrated with standard CMOS devices on a common substrate. Moreover, it will become apparent to those skilled in the art given the teachings herein that numerous modifications can be made to the embodiments shown that are within the scope of the claimed invention. That is, no limitations with respect to the embodiments shown and described herein are intended or should be inferred.

For the purpose of describing and claiming embodiments of the invention, the term MISFET as may be used herein is intended to be construed broadly and to encompass any type of metal-insulator-semiconductor field-effect transistor. The term MISFET is, for example, intended to encompass semiconductor field-effect transistors that utilize an oxide material as their gate dielectric (i.e., MOSFETs), as well as those that do not. In addition, despite a reference to the term "metal" in the acronyms MISFET and MOSFET, the terms MISFET and MOSFET are also intended to encompass semiconductor field-effect transistors wherein the gate is formed from a non-metal such as, for instance, polysilicon; the terms "MISFET" and "MOSFET" are used interchangeably herein.

Although the overall fabrication method and structures formed thereby are entirely novel, certain individual processing steps required to implement a portion or portions of the method(s) according to one or more embodiments of the invention may utilize conventional semiconductor fabrication techniques and conventional semiconductor fabrication tooling. These techniques and tooling will already be familiar to one having ordinary skill in the relevant arts. Moreover, many of the processing steps and tooling used to fabricate semiconductor devices are also described in a number of readily available publications, including, for example: P. H. Holloway et al., *Handbook of Compound Semiconductors: Growth, Processing, Characterization, and Devices*, Cambridge University Press, 2008; and R. K. Willardson et al., *Processing and Properties of Compound Semiconductors*, Academic Press, 2001, which are hereby incorporated by reference herein. It is emphasized that while some individual processing steps are set forth herein, those steps are merely illustrative and one skilled in the art may be familiar with several equally suitable alternatives that would also fall within the scope of the present invention.

It is to be understood that the various layers and/or regions shown in the accompanying figures are not necessarily drawn to scale. Furthermore, one or more semiconductor layers of a type commonly used in such integrated circuit devices may not be explicitly shown in a given figure for economy of description. This does not imply, however, that the semiconductor layer(s) not explicitly shown are omitted in the actual integrated circuit device.

As previously stated, RF PAs have become increasingly critical for use in mobile and wireless device applications, such as, but not limited to, cell phones, mobile computing devices (e.g., tablet computers), wireless network devices, etc. These mobile applications place stringent requirements on the voltage and frequency capabilities of the RF PA, which are typically mutually exclusive properties; that is, devices that offer acceptable high-frequency performance often exhibit poor high-voltage performance, and vice versa. RF PAs based on standard CMOS technologies often exhibit poor performance, due at least in part to low efficiency, low breakdown voltage and poor linearity, among other factors. Similarly, RF PAs based on standard DMOS technologies are difficult to integrate with supporting high-speed CMOS control logic, since conventional DMOS and CMOS fabrication technologies are generally incompatible with one another. Moreover, proposed solutions for overcoming some of the problems inherent in conventional CMOS-based technologies, particularly in an RF PA application, have been predominantly unsuccessful.

Following Moore's Law, gate lengths in CMOS technology have been decreasing, which ultimately increases the speed of the CMOS technology. With reduced gate length, MOS devices can have a cut-off frequency ($f_T$) of over a few hundred gigahertz (GHz). In an illustrative cellphone application, the normal operating frequency for an RF PA is in a range of less than a few GHz, which requires the $f_T$ of the transistor to be about 15 GHz or above. Thus, the $f_T$ for modern CMOS devices is sufficient for the needs of RF PAs. Furthermore, employing a fully silicided gate significantly decreases gate resistance of the MOS device, thereby increasing a unity power gain frequency, also known as maximum oscillation frequency, $f_{MAX}$. Thus, as CMOS technology continues to scale down, the $f_T$ and the $f_{MAX}$ of a MOS transistor can exceed more than 100 GHz in advanced deep submicron technology, which extends the operational limit of CMOS circuits for wireless applications. Unfortunately, low breakdown voltage and low output current of MOSFET devices limit their application in RF applications; for example, a CMOS RFPA can reach only about 30% efficiency compared to about 45% efficiency for DMOS devices.

FIG. 1 is a cross-sectional view depicting at least a portion of an exemplary semiconductor structure including a laterally diffused metal-oxide-semiconductor (LDMOS) transistor device 100. The LDMOS device 100 includes a substrate 102 which, in one or more embodiments, is formed of single-crystalline silicon (e.g., having a<100> or <111> crystal orientation). Suitable alternative materials for forming the substrate 102 may also be used, such as, but not limited to, germanium, silicon germanium, silicon carbide, gallium arsenide, gallium nitride, or the like. Additionally, in one or more embodiments the substrate 102 is preferably modified by adding an impurity or dopant (e.g., boron, phosphorus, arsenic, etc.) to change a conductivity of the material (e.g., n-type or p-type). In one or more embodiments, where the LDMOS device 100 is an NMOS transistor, the substrate 102 is of p-type conductivity and may thus be referred to as p-substrate (P-SUB). A p-substrate may be formed by adding a p-type impurity or dopant (e.g., Group III elements, such as boron) of a prescribed concentration level (e.g., about $10^{14}$ to $10^{19}$ atoms per cubic centimeter) to the substrate material, such as by using a diffusion or implant step, to change the conductivity of the material as desired. In one or more alternative embodiments, where the LDMOS device 100 is a PMOS transistor, an n-type substrate (N-SUB) may be formed by adding an n-type impurity or dopant (e.g., Group V elements, such as phosphorus) of a prescribed concentration level to the substrate material.

A plurality of shallow trench isolation (STI) structures 104 are formed in the substrate 102 for electrically isolating prescribed portions of the semiconductor structure. As is well known by those skilled in the art, STI structures are created at an early stage during the semiconductor device fabrication process, before transistors are formed. The main steps of an STI process involve forming trenches in an upper surface of the substrate 102, using, for example, standard lithographic patterning and etching, depositing one or more dielectric materials (e.g., silicon dioxide) to fill the trenches, and then removing excess dielectric material using a planarization technique, such as, for example, chemical-mechanical planarization/polishing (CMP). Once the STI structures 104 have been defined, transistors are formed between adjacent STI structures. For simplification purposes, FIG. 1 illustrates a single LDMOS transistor, although it is to be appreciated that the semiconductor structure can include multiple LDMOS devices.

The LDMOS transistor 100 includes a source region 106, a drain region 108 and a gate 110. The source and drain regions 106 and 108, respectively, are formed proximate an upper surface of the substrate 102 and spaced laterally from one another. The source and drain regions 106, 108 are preferably doped, such as by a conventional implant step, with an impurity of a known concentration level to selectively change the conductivity of the material as desired. In one or more embodiments, the source and drain regions 106, 108 have a conductivity type associated therewith which is opposite a conductivity type of the substrate 102, so that active regions can be formed in the device. In a preferred embodiment, the source and drain regions 106, 108 are of n-type conductivity. A region 107 having a conductivity type the same as the substrate 102 and a body (or well) region 112 is formed proximate the upper surface of the substrate and adjacent to the source region to form a ground contact for the substrate and source region.

The body region 112, in one or more embodiments, is formed proximate the upper surface of the substrate 102 using a deep diffusion or implant step from the source-side, extending laterally under the gate 110 to thereby form a graded channel region 114; the source region 106 and region 107 are formed within at least a portion of the body region 112. During the diffusion step used to form the body region 112, an impurity of a conductivity type (e.g., n-type or p-type) which is opposite to that of the source and drain regions is used. For example, in the case of an n-type LDMOS device, a p-body region is preferably formed using a p-type impurity (e.g., boron) of a prescribed concentration level. Alternatively, in the case of a p-type LDMOS device, an n-body region may be formed using an n-type impurity (e.g., phosphorus or arsenic) of a prescribed concentration level.

The channel region 114 is formed in the substrate 102 under at least a portion of the gate 110 and between the body region 112 and a lightly-doped drain/drift (LDD) region 116. In one or more embodiments, the channel region 114 may be formed, for example, by diffusing or implanting an impurity of a known concentration level and same conductivity type to that of the substrate 102 into the channel region. Dimensionally, a length of the channel is defined by the gate length in a self-aligned process, designated as dimension A in FIG. 1, although an effective (i.e., electrical) channel length will be slightly less than its drawn length due, at least in part, to diffusion of the source and drain regions under the gate (i.e., gate-source and gate-drain overlap).

The LDD region 116 of the LDMOS device 100 is formed in the substrate 102 proximate the upper surface of the substrate and extending laterally between the channel region 114 and the drain region 108. As previously stated, a portion of the LDD region 116, designated as the area defined by dimension B in FIG. 1, may diffuse under the gate 110. A gate-to-drain capacitance, $C_0$, is directly attributable to this gate/LDD overlap, and therefore dimension B should be minimized for improved high-frequency performance. In one or more embodiments, the LDD region 116 may comprise multiple regions (not explicitly shown, but implied) of different doping levels, so as to create a graded LDD region. The LDD region 116, in one or more embodiments, may be formed by using a diffusion or implant step. In a preferred embodiment, during the formation of the LDD region 116, an n-type impurity (e.g., arsenic or phosphorous) of a prescribed concentration level is preferably employed. The LDD region 116 will form at least a portion of a drift region in the LDMOS device 100.

A thin dielectric layer 118 is formed on the upper surface of the substrate 102. The thin dielectric layer 118 may comprise an insulating material, such as, for example, silicon dioxide ($SiO_2$), that is grown or deposited on the upper surface of the substrate to a desired thickness (e.g., about 50-400 angstroms). The gate 110, in one or more embodiments, comprises a polycrystalline silicon (polysilicon) layer formed over the thin dielectric layer 118, such as, for example, using a chemical vapor deposition (CVD) technique. The thin dielectric layer 118 under the gate 110 is commonly referred to as "gate oxide," since it often comprises an oxide which electrically isolates the gate 110 from the drain and/or source regions of the device. The polysilicon layer is generally patterned using, for example, a conventional photolithographic process, and followed by an etching step (e.g., dry etching) to form the gate 110, as will be understood by those skilled in the art.

For the purpose of reducing gate resistance and reducing source/drain contact resistance in the LDMOS device 100, the gate polysilicon and source/drain regions in the device are silicided, in one or more embodiments. To accomplish this, a metal (e.g., a transition metal such as cobalt, nickel, titanium, etc.) is deposited over the surface of the wafer, for example using a CVD or physical vapor deposition (PVD) process, followed by an anneal process. When the metal is deposited on silicon, the anneal causes the metal to react with the underlying silicon to form low-resistivity silicide layers 120, 122 and 124 on the source region 106, drain region 108 and gate 110, respectively. A temperature of the anneal will depend primarily on the type of metal being deposited. For instance, when nickel is used as the metal, an anneal temperature of about 450 degrees Celsius (° C.) is required to form nickel silicide ($NiSi_2$). When cobalt is used as the metal, an anneal temperature of about 800° C. is required to form cobalt silicide ($CoSi_2$). Thus the type of metal used in the silicide process causes a large variation in the required anneal temperature. Some metals, such as tungsten, require an anneal temperature (e.g., about 1000° C.) which is incompatible with a standard CMOS gate fabrication process.

In order to prevent the deposited metal from reacting with unwanted regions of the LDMOS device 100, such as, for example, the LDD region 116 or body region 112, insulating spacers 126 are deposited on sidewalls of the gate structure 110, in one or more embodiments. The sidewall spacers 126 are preferably formed of a dielectric material, such as silicon dioxide or silicon nitride, which is deposited using, for example, a CVD process.

Unfortunately, while siliciding the gate and source/drain regions may improve the high-frequency performance of the LDMOS device 100, this silicide 120, 122, 124 lowers the breakdown voltage of the device. To increase the breakdown voltage of the device, a longer gate can be employed. However, increasing the gate length will reduce the speed of the device (e.g., by increasing gate capacitance), thereby negating, to at least some extent, the benefits of the silicide process.

Another way to improve breakdown voltage in a MOSFET device is to employ a non-silicide drift region between the gate and drain regions, designated as the area defined by dimension C in FIG. 1. The gate and drain regions can be covered partially during the silicide formation. In the partially silicided gate, especially with short gate lengths, a first portion of the gate (e.g., about half) is covered with oxide and a second portion of the gate is silicided. This means that only the first portion of the gate 110 (the silicided portion) will exhibit a reduced gate resistance while the gate resistance attributable to the second portion of the gate, the non-silicided portion represented as the area defined by dimension D in FIG. 1, will remain high; this results in an overall increase in the gate resistance. Since the gate is partially covered during the silicide formation, the area for the silicided gate is highly dependent on process alignment, which can exhibit a large variation. This leads to a corresponding large variation in the gate resistance of the LDMOS device.

Figure 2:
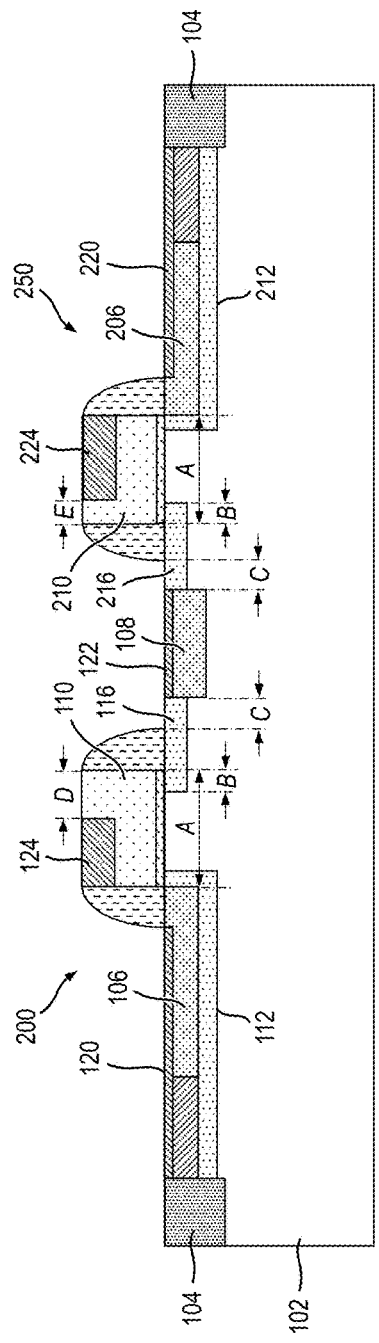
FIG. 2 is a cross-sectional view depicting at least a portion of an exemplary semiconductor structure including two LDMOS transistor devices having common drain pairs.

In order to reduce cell pitch, and thus total device area and cost, a MOSFET structure can be designed having common drain pairs and mirrored devices. At least a portion of an illustrative semiconductor structure including two LDMOS devices having common drain pairs is shown in FIG. 2. With reference to FIG. 2, a first LDMOS device 200 is formed in a manner consistent with the LDMOS device 100 shown in FIG. 1. A second LDMOS device 250 is essentially a mirror image of the first LDMOS device 200 and is formed in a similar fashion. Specifically, the second LDMOS device 250, includes a source region 206, formed in a body region 212 in the substrate 102, a gate 210, and an LDD region 216. A drain region of the second LDMOS device 250 shares the drain region 108 of the first LDMOS device 200 to thereby reduce drain junction capacitance, as previously stated. The second LDMOS device 250 further includes a silicide layer 220 formed on the source region 206 and a silicide layer 224 formed on a portion of the gate 210. Like dimension D, which represents a non-silicided portion of the gate 110 of the first LDMOS device 200, dimension E in FIG. 2 represents a non-silicided portion of the gate 210 of the second LDMOS device 250.

Any misalignment of the partial gate silicide process may cause a further larger variation in the gate resistance. By way of illustration only, if ideally half of the gate is silicided and the other half of the gate is non-silicided, the gate resistance is of the lowest value, but is still twice as high compared to a fully silicided gate. This will result in a reduction in the speed of the device by about 50%, which significantly degrades the performance of the RF PA. If the gate is partially covered with a misalignment (the misalignment is to be avoided), for example, for the common/shared drain pair configuration shown in FIG. 2, when one gate is covered less than half of the gate area, then the other gate will be covered more than half of the gate area; so the gate resistance for one LDMOS device is reduced and the gate resistance for the other LDMOS device is increased. The LDMOS device with the lower gate resistance will demonstrate a higher speed capability compared to the LDMOS device with the higher gate resistance. This device mismatch, wherein the pair of two LDMOS devices have different drain-source on-resistance ($R_{Ds,on}$), $I_{Dlin}$ and hence different switching speed, results in lower power gain and distortion (i.e., nonlinearity) of the RF output power signal in an RF PA application. Consequently, there is a need for a consistent and robust process for forming low gate resistance over large LDMOS devices for high-frequency, high-voltage applications (e.g., in an exemplary power LDMOS embodiment, there can be thousands to tens of thousands of LDMOS devices with gates configured in parallel, reaching a total gate length of about 0.1 mm to 1000 mm).

In a bipolar/CMOS/DMOS (BCD) process technology, an LDMOS device is often designed for high-voltage operation. An LDMOS device optimized for high-voltage operation is typically configured having a long drift region and a long gate; the long drift region is needed to support high breakdown voltage, while the long gate is used to protect the channel from hot-carrier effects (e.g., hot-carrier injection (HCI) or hot-carrier induced degradation) for better reliability. For example, if the gate length for typical CMOS devices is 0.5 µm, the gate length for the LDMOS device would be about 1 µm or longer. With modern CMOS technology, the junction depth is very shallow and at the same time channel length for the LDMOS device is very short. For example, if the gate length for the LDMOS device is 0.6 µm, the channel length under the gate can be as short as 0.2 µm.

To overcome the associated short channel effects and hot-carrier effects, an LDD region (e.g., LDD region 116 in FIG. 1) is formed between the gate and drain region, with the gate overlapping the LDD region to some extent (e.g., the area defined by dimension B in FIG. 1). However, this overlap leads to high gate-to-drain capacitance $C_{gd}$, as previously stated. The high $C_{gd}$ significantly decreases the switching speed of the LDMOS device. Thus, one or more embodiments of the invention advantageously improve switching speed by reducing the gate length of the LDMOS device, without substantially compromising high-voltage performance, and using standard CMOS and/or CMOS-compatible process technology. In this manner, power RF LDMOS devices can be easily integrated with CMOS high-speed logic and/or other circuitry.

Aspects of the present disclosure provide a method and corresponding power semiconductor structure for fabricating high-speed power DMOS devices using CMOS-based process technology in such a manner that the power DMOS devices are readily integratable with high-speed CMOS devices on a common substrate. A DMOS device is designed, in one or more embodiments, having a short gate length with a tungsten silicide ($WSi_2$) gate for low resistivity. By way of example only and without limitation, the gate length for the CMOS devices is about 0.18 μm or longer, and the gate length for the DMOS device is about 0.24 In accordance with one or more embodiments, after the tungsten silicide gate of the DMOS device is formed, a channel of the DMOS device is formed by self-aligned implantation from the source side of the DMOS device. On the source side, a body region is formed by implanting with the drain side covered. A shallow source is formed inside the body region to connect the channel out to the source region. On the drain side, a lightly-doped drift region is formed by implantation, in one or more embodiments. For high-voltage devices, such as devices having a breakdown voltage higher than about 15 volts, to reduce the electric stress of the channel and gate corner, a field plate is formed, in one or more embodiments, after the doping of the DMOS device is completed. For low-voltage devices, no field plate is needed.

A new architecture for integrated CMOS-DMOS devices is described herein, according to one or more embodiments of the invention. For at least the DMOS device, the architecture uses a self-aligned silicided (e.g., $WSi_2$) gate, the details of which are described in further detail below. A drain region of the DMOS device is separated from the gate by a self-aligned lightly-doped drift region. The gate of the DMOS device is fully silicided for a low gate resistance while the lightly-doped drift region, which is not silicided, is configured to sustain a high breakdown voltage. The CMOS devices, in one or more embodiments, are fabricated using a standard CMOS technology after formation of the DMOS gate and after the DMOS area is covered by a dielectric layer. It is to be appreciated that in one or more embodiments, once the tungsten silicide process for forming the DMOS gate has been completed, the remaining process steps for forming the DMOS and CMOS devices can be performed in essentially any order, since no further high-temperature annealing is required; that is, the order of processing can be changed, with differences mainly attributable to process simplicity and/or efficiency.

More particularly, the gate, source and drain of the CMOS device, in one or more embodiments, is silicided, for example, using a traditional self-aligned method. Deep submicron CMOS devices preferably use low-temperature metal silicides such as, for example, titanium silicide ($TiSi_2$), cobalt silicide ($CoSi_2$), nickel silicide ($NiSi_2$), or the like, over polysilicon as the gate materials. The term "deep submicron" as used herein is intended to broadly refer to CMOS devices having minimum channel lengths of less than 0.35 μm. It is to be understood that tungsten silicide ($WSi_2$) is generally not used in forming the deep submicron CMOS gate, since its requisite high anneal temperature causes too much dopant diffusion which destroys the shallow source/drain junction required by such devices; the shallow junction requirements therefore limit the maximum thermal budget allowed for silicidation. The DMOS gate is formed, in one or more embodiments, prior to forming the CMOS gate, as previously stated. For example, the DMOS gate is formed and then covered, such as by applying photoresist, and then the CMOS gate is formed. The CMOS gate may use the same or different materials as the DMOS gate. As such, the DMOS device can be beneficially integrated with any CMOS technology node. In some applications, for example, where CMOS gates and DMOS gates use the same material (e.g., $CoSi_2$), they are formed concurrently.

Figure 3:
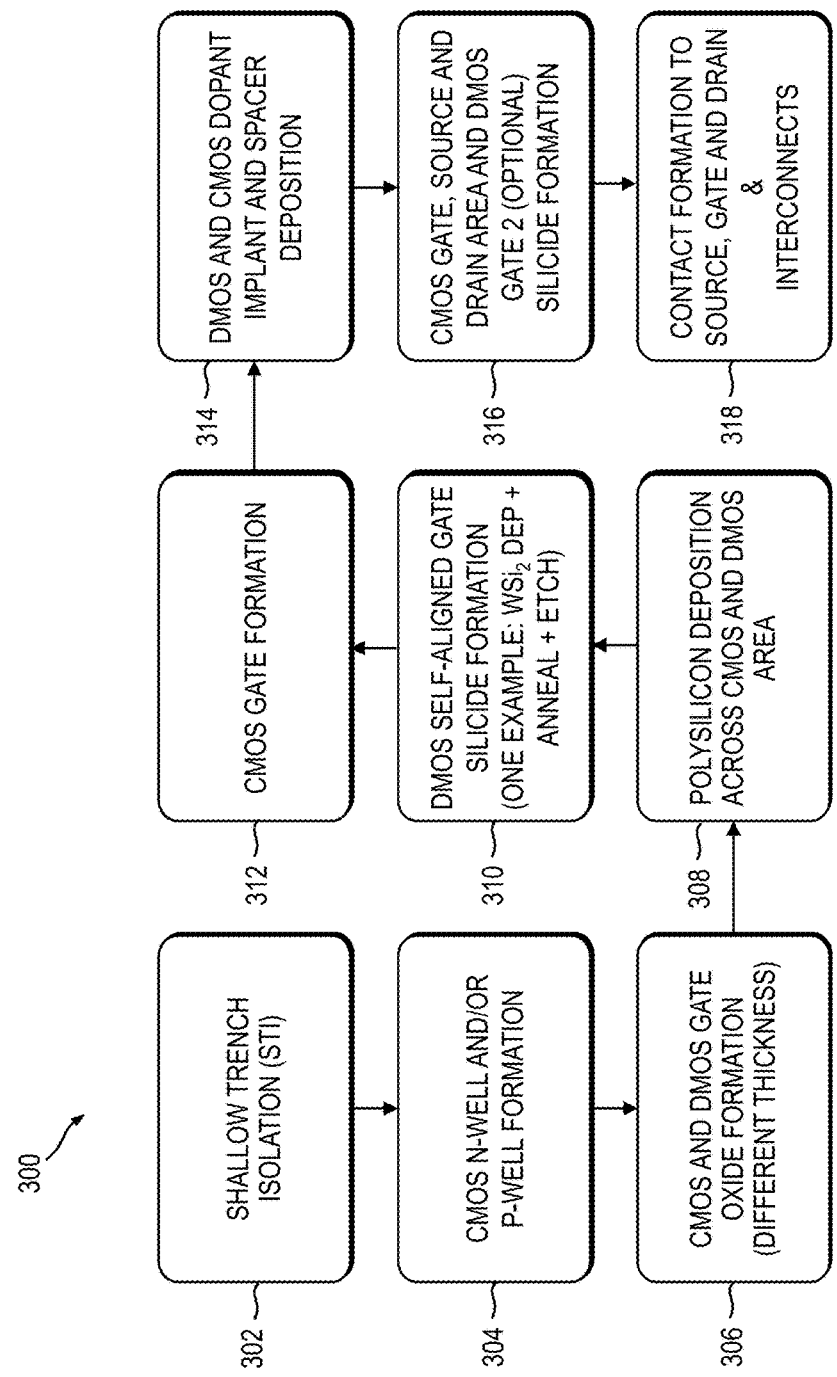
FIG. 3 is a flow diagram depicting at least a portion of an exemplary method for fabricating a power semiconductor device having DMOS and CMOS devices integrated on the same substrate, according to an embodiment of the invention.
Figure 4:
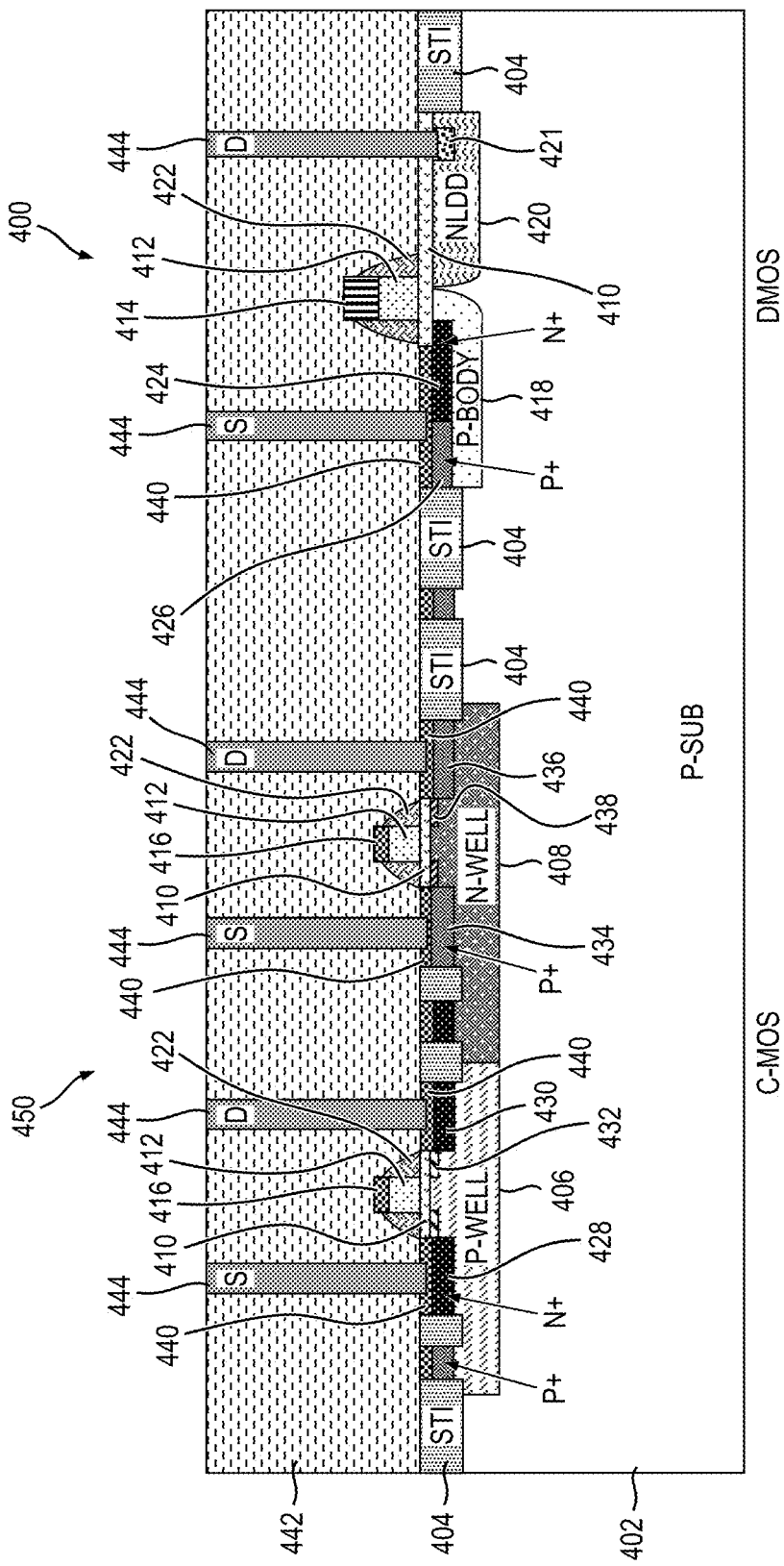
FIG. 4 is a cross-sectional view depicting at least a portion of an exemplary semiconductor structure including a DMOS device and a CMOS device integrated together on a common substrate, according to an embodiment of the invention.

FIG. 3 is a flow diagram depicting at least a portion of an exemplary method 300 for fabricating a power semiconductor device having DMOS and CMOS devices integrated on the same substrate, according to an embodiment of the invention. FIG. 4 is a cross-sectional view depicting at least a portion of an exemplary semiconductor structure including at least one DMOS device 400 and at least one CMOS device 450 integrated together on a common substrate in a manner consistent with the method 300 of FIG. 3, according to an embodiment of the invention.

With reference to FIGS. 3 and 4, the method 300 begins in step 302 with the formation of a plurality of STI structures 404 in a substrate 402 of the semiconductor device. The STI process, in one or more embodiments, involves forming trenches in an upper surface of the substrate 402, using, for example, standard lithographic patterning and etching, depositing one or more dielectric materials (e.g., silicon dioxide) to fill the trenches, and then removing excess dielectric material using a planarization technique, such as, for example, CMP. As previously stated, the STI structures serve to electrically isolate adjacent semiconductor device components formed on the same substrate. In the illustrative embodiment shown in FIG. 4, a p-type substrate (P-SUB) is employed, although embodiments of the invention are not limited to a p-type substrate.

Step 304 involves the formation of one or more p-type wells (p-wells) 406 and one or more n-type wells (n-wells) 408 in the substrate 402. As is known by those skilled in the art, well formation, in one or more embodiments, typically includes oxidation of the wafer at high temperature (e.g., about 1100° C.) to form an oxide layer (e.g., $SiO_2$) on the upper surface of the wafer. A photoresist layer is then deposited on the oxide layer and is patterned, using p-well and n-well masks in a lithographic process, and etched (e.g., using a wet etchant, such as hydrofluoric acid (HF)) to create openings through the oxide layer defining where the p-wells 406 and n-wells 408 are to be formed. The p-well 406 is formed by adding a p-type impurity of a prescribed doping level to the underlying substrate 402 through the p-well opening in the oxide layer, such as by a diffusion or implant process. Likewise, the n-well 408 is formed by adding an n-type impurity of a prescribed doping level to the underlying substrate 402 through the n-well opening in the oxide layer, such as by diffusion or implantation. The oxide layer is then stripped from the upper surface of the wafer and the method 300 continues.

Alternatively, in a single-well CMOS embodiment, a more heavily-doped epitaxial layer (not explicitly shown) is formed in the substrate. Native MOS devices (i.e., MOS devices that are of the same conductivity type as the epitaxial layer) are formed directly in the epitaxial layer, rather than in their own separate wells, and non-native MOS devices (i.e., MOS devices having a conductivity type opposite that of the epitaxial layer) are formed in their own wells in the epitaxial layer. The so called twin-well technology shown in FIG. 4 has advantages over single-well CMOS. First, it allows the substrate to be lightly doped, either n-, p- or epitaxy-type. It also allows individual control and optimization of the doping profiles of NMOS and PMOS devices. Furthermore, the twin-well approach allows the use of a more lightly doped substrate (e.g., resistivity of about 100-150 Ω-cm). Particularly for the CMOS devices 450, the illustrative twin-well structure shown in FIG. 4 beneficially helps reduce the occurrence of latch-up.

In step 306, a gate oxide layer 410 of the DMOS device 400 and CMOS devices 450 is formed over at least a portion of the upper surface of the substrate 402. The gate oxide layer, which comprises a dielectric material (e.g., $SiO_2$), serves to electrically isolate the gate terminal of an MOS device from its underlying conductive channel and source and drain regions. In one or more embodiments, the gate oxide layer 410 is thinner in cross section for the CMOS devices 450 compared to the gate oxide for the DMOS device 400. That is, the gate oxide layer 410 for the DMOS device 400 is formed having a first cross-sectional thickness and the gate oxide for the CMOS devices 450 is formed having a second cross-sectional thickness, the first thickness being greater than the second thickness.

In one or more embodiments, formation of the gate oxide layer 410 involves performing a thermal oxidation on the wafer at a prescribed temperature and duration, although other oxide formation processes are similarly contemplated (e.g., CVD). The oxide is then stripped from the CMOS device portion of the wafer, and the wafer is again subjected to thermal oxidation at a second prescribed temperature and duration to form a desired gate oxide thickness over the CMOS device portion of the wafer. Since the oxide layer was left over the DMOS device portion of the wafer, the gate oxide layer 410 will be thicker over the DMOS device portion compared to the CMOS device portion of the wafer.

In step 308, a blanket polysilicon layer 412 is formed over the wafer, on at least a portion of the gate oxide layer 410, for the DMOS and CMOS devices 400, 450. Next, in step 310 a blanket metal layer 414, preferably tungsten (W) or tungsten silicide (e.g., CVD-deposited $WSi_2$), is deposited (e.g., using CVD with $SiH_4/WF_6$, or PVD sputtering of $WSi_x$ target, or the like) over at least a portion of the polysilicon layer 412. In one or more embodiments, CVD-deposited $WSi_2$ has certain advantages, including less polysilicon thickness required, and tungsten, being so brittle, poses challenges in making a PVD target.

The film stack, comprising the metal silicide layer 414 and the polysilicon layer 412, is then patterned (e.g., using a standard lithography process) and etched to form a gate structure of the DMOS device 400. An anneal process is then performed at an appropriate temperature for the deposited metal to react with the underlying polysilicon so as to cause a metal silicide to form; the temperature at which the anneal process is performed will be a function of the type of metal deposited. Alternatively, the silicide formation anneal can be performed before the gate stack etch process. Thus, in step 310 a self-aligned silicide process is performed to form the gate of the DMOS device 400, while the gates of the CMOS devices 450 are left unsilicided for the moment. The term "self-aligned silicide," in this context, refers broadly to a process whereby the metal and polysilicon are defined and etched in the same step as a stack. In this manner, the gate of the DMOS device 400 is fully silicided, according to embodiments of the invention. Moreover, this self-aligned silicide process sequence advantageously ensures the full conversion of polysilicon to the desired silicide independent of lithography variations.

In one or more embodiments, the metal layer 414 comprises a transition metal, such as, but not limited to, tungsten, cobalt, nickel, titanium, etc. In a preferred embodiment, tungsten silicide (WSi) is employed as the metal layer 414 deposited on the DMOS gate polysilicon layer 412 and the wafer is annealed at a temperature of about 950° C. for about 30 minutes to form a tungsten silicide ($WSi_2$) gate of the DMOS device 400. Tungsten silicide has a resistivity of about 12.5 $\mu\Omega$-cm, which is lower than other silicides, such as cobalt silicide which has a resistivity of about 18-20 $\mu\Omega$-cm. Tungsten silicide is also capable of withstanding higher processing temperatures compared to other silicide materials.

Once processing of the DMOS gate structure has been completed, a dielectric layer is deposited over the upper surface of the wafer, covering at least the DMOS device area. Then, a window is opened through the dielectric layer (e.g., by etching) to expose the CMOS devices area. In step 312, a silicide process is performed on the CMOS device gates. In one or more embodiments, the CMOS device gates, like the DMOS device gate, utilizes a self-aligned silicide process. Thus, step 312 is consistent with the self-aligned DMOS gate silicide process of step 310.

Specifically, the polysilicon layer 412 is etched to form the CMOS gates, followed by various implant steps to form body, source and drain dopant regions of both the CMOS and DMOS devices, as will be described herein below in conjunction with step 314. Then, dielectric spacers (e.g., silicon oxide or silicon nitride) are formed on sidewalls of the CMOS and DMOS gates, followed by more dopant implant steps. A metal layer 416 (e.g., cobalt, nickel, titanium, etc.) is then deposited on an upper surface of the polysilicon layer 412 of the CMOS devices 450 and the exposed Si surface of the source and drain regions. The film stacks, comprising polysilicon layer 412 and metal layer 416, are then annealed at a temperature appropriately suited for the deposited metal layer 416 to thereby form a silicided layer over the gate and source and drain areas of each of the CMOS devices 450. The unsilicided metal (i.e., metal that was deposited over non-silicon areas of the semiconductor device) is then easily etched away (without a mask) to form fully silicided gate stacks of the respective CMOS devices 450, as well as silicided source and drain regions (after annealing).

Preferably, the metal used to form the silicided gates of the CMOS devices 450 is chosen so that it has a phase transition temperature which is lower than that of the metal used to form the silicided gate of the DMOS device 400. For example, in one or more embodiments, cobalt is used for the metal layer 416 deposited on the polysilicon layer 412 of the CMOS devices 450 and the wafer is annealed at a temperature of about 800° C. for about 30 minutes to form a cobalt silicide ($CoSi_2$) layer 416. By using the self-aligned silicide process, the gates of the CMOS devices 450 are fully silicided, according to one or more embodiments of the invention.

As previously stated, with regard to the anneal step performed for the DMOS and CMOS devices, the temperature of the anneal will depend largely on the type of metal being deposited. It is to be appreciated that in one or more embodiments in which the metal used to form the gate silicide layers 414, 416 for the DMOS and CMOS devices 400, 450 is the same, the silicide process for both the DMOS device (step 310) and CMOS devices (step 312) can be performed concurrently.

DMOS and CMOS dopant implants and dielectric spacers are formed in step 314. Specifically, from a source-side of the DMOS device 400, a body region 418, which in this embodiment is of p-type conductivity (p-body), is formed proximate the upper surface of the substrate 402 starting from an STI structure 404 closest to the source and extending laterally to the gate 412. The body region 418 is formed, in one or more embodiments, by implanting an impurity (dopant) of a desired conductivity type and concentration level into a defined region of the substrate 402 and performing a diffusion process to drive (i.e., distribute) the impurity deeper into the substrate. As a result of the diffusion step, at least a portion of the body region 418 will extend under the gate to form at least part of a conducting channel in the DMOS device 400.

Similarly in step 314, from a drain-side of the DMOS device 400, a drift region 420, which in this embodiment is an n-type lightly doped drain (NLDD) region, is formed proximate the upper surface of the substrate starting from an STI structure closest to the drain and extending laterally to the body region 418. The drift region 420, in one or more embodiments, is formed by implanting an impurity of a conductivity type opposite that of the body region 418 and a prescribed concentration level into a defined region of the substrate 402 and performing a diffusion step to drive the impurity deeper into the substrate. As a result of the diffusion step, at least a portion of the drift region 420 will extend under the gate adjacent to the body region 418.

In step 314, dielectric spacers 422 are formed on sidewalls of the gate stack for the DMOS and CMOS devices. The spacers 422 may be formed using, for example, a standard deposition process, such as CVD or the like. The material used to form the spacers comprises, in one or more embodiments, a silicon oxide (e.g., $SiO_2$), or silicon nitride ($Si_3N_4$), or silicon oxynitride (SiON), although other insulating materials are similarly contemplated. The spacers 422 provide a means of self-aligning the source and drain regions with the gate, thereby more accurately controlling silicide formation on the source and drain regions of the devices compared to a lithographic process which exhibits more variation.

A source region 424 is formed in the DMOS device 400 in at least a portion of the body region 418, the source region having a conductivity type opposite that of the body region. Specifically, in this illustrative embodiment, an n-type implant is performed in a defined area of the body region 418. A p-type region 426 is also formed in the body region 418 laterally adjacent to the source region 424. The p-type region 426, which may be formed by implanting a p-type impurity of a prescribed concentration level into the body region 418, functions at least in part to help ground the substrate 402.

After completing the DMOS device 400, the CMOS devices 450, in one or more embodiments, may be fabricated in a conventional manner. Specifically, source and drain regions of the CMOS devices 450 are formed in their respective wells 406 and 408. For the device formed in the p-well 406, which will become an NMOS device, an n-type impurity is implanted into defined regions of the p-well followed by diffusion to form a source region 428 and a drain region 430 of the NMOS device. The source and drain regions 428, 430, in this illustrative embodiment, are defined on one side by an STI structure 404 and on an opposite side by the spacers 422. As a result of the diffusion process, a portion of the n-type source and drain regions will extend under the gate spacers to form respective diffusion regions 432. The diffusion regions 432 function essentially as an equivalent to the LDD region in a DMOS device so as to mitigate hot carrier effects caused by short channels.

Likewise, for the device formed in the n-well 408, which will become a PMOS device, a p-type impurity is implanted into defined regions of the n-well followed by diffusion to form a source region 434 and a drain region 436 of the PMOS device. The source and drain regions 434, 436, in this illustrative embodiment, are defined on one side by an STI structure 404 and on an opposite side by the spacers 422. As a result of the diffusion process, a portion of the p-type source and drain regions will extend under the gate spacers to form respective diffusion regions 438 in a manner consistent with the diffusion regions 432.

In step 316, the source and drain regions of each of the CMOS devices 450, as well as the source region 424 of the DMOS device 400, undergo a silicide process. In this step 316, a blanket metal layer 440 (e.g., cobalt, titanium, nickel, etc.) is deposited over the source and drain regions 428, 430, 434 and 436 of the CMOS devices 450 and the source region 424 of the DMOS device 400. Since the NLDD region 420 of the DMOS device 400 is covered by an oxide layer 410, the deposited metal layer 440 will not react with the NLDD region, and therefore no siliciding of the drain region of the DMOS device will occur. This is important to maintain a high breakdown voltage in the DMOS device. During this step, a small portion of the NLDD region 420 is exposed to allow deposition of a metal layer 421 in the NLDD region which, after siliciding, will be used, in one or more embodiments, to provide a low-resistance electrical connection with a subsequently formed drain contact of the DMOS device 400 while sustaining a large electrical potential gradient between drain and source electrodes.

After annealing at a temperature appropriate for the deposited metal, a silicide layer is formed on the source and drain regions of the CMOS devices 450, the source region of the DMOS device 400, and drain contact interface of the DMOS device. Any unreacted metal is removed, such as by using a wet etching process.

In step 318, a dielectric layer 442, such as, for example, an oxide (e.g., $SiO_2$), is formed over the wafer. Openings are formed through the dielectric layer 442 to expose the source and drain regions of the respective DMOS and CMOS devices. The openings through the dielectric layer 442 may be formed, for example, by etching (e.g., reactive ion etching (ME)). The openings are then filled with a conductive material, such as a metal (e.g., aluminum, gold, etc.) to thereby form contacts of the DMOS and CMOS devices for providing electrical connection to the devices.

Figure 5:
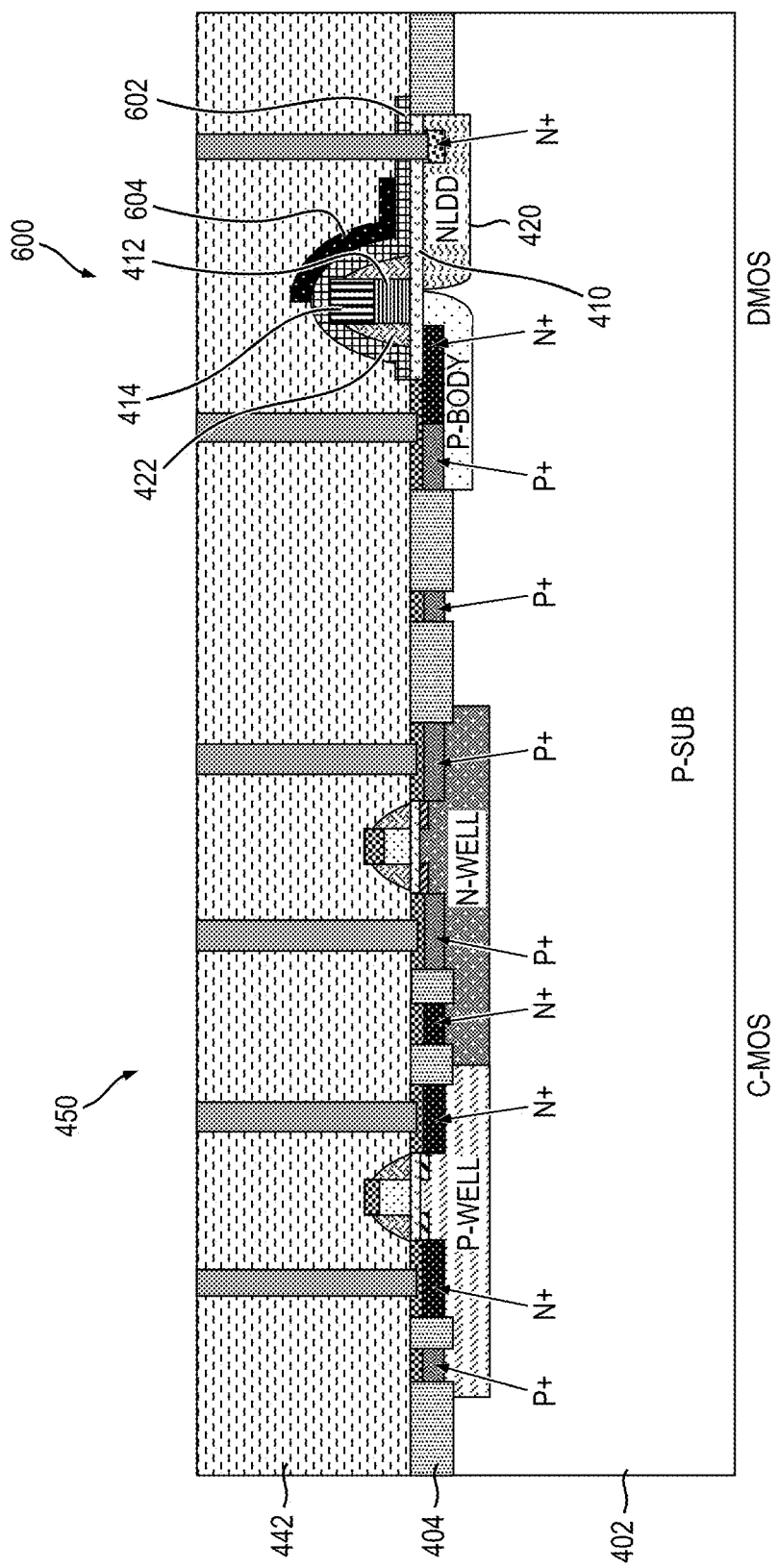
FIG. 5 is a cross-sectional view depicting at least a portion of an exemplary semiconductor structure including a DMOS device and a CMOS device integrated together on a common substrate, according to another embodiment of the invention.

If a high-voltage DMOS device is required, a second gate, which may be referred to herein as a field plate, can be included in the DMOS device. FIG. 5 is a cross-sectional view depicting at least a portion of an exemplary semiconductor structure including a DMOS device and a CMOS device integrated together on a common substrate, according to another embodiment of the invention. In this illustrative embodiment, the semiconductor structure includes CMOS devices (NMOS and PMOS transistors) formed in the manner previously described in conjunction with FIG. 4, and further includes a DMOS device 600 integrated on the same substrate 402. The DMOS device 600 is essentially formed in a manner consistent with the DMOS device 400 shown in FIG. 4, except that DMOS device 600 includes a second gate (field plate) which serves as a shielding structure for further increasing breakdown voltage in the device.

Specifically, with reference to FIG. 5, the DMOS device 600 includes a dielectric layer 602 formed over at least a portion of the DMOS gate stack, including polysilicon layer 412 and metal/silicide layer 414, and sidewall spacers 422. A metal layer 604, or metal silicide layer or other conductive layer, is formed on at least a portion of the dielectric layer 602. The metal silicide layer 604, which is formed proximate a drain-side corner of the DMOS gate, serves as a shielding structure or field plate to help distribute the high electric field potential gradient over the NLDD region 420 of the DMOS device 400, rather than concentrating the electric field at the gate corner.

Given the discussion thus far, it will be appreciated that an exemplary semiconductor device includes at least one LDMOS structure and at least one CMOS structure integrated with the LDMOS structure on a common substrate. The LDMOS structure includes a first fully silicided gate comprising a first metal silicide material. The CMOS structure a second fully silicided gate comprising a second metal silicide material. The second fully silicided gate is separate from the first fully silicided gate. In one or more embodiments, the first gate comprises tungsten silicide and the second gate comprises a metal silicide material other than tungsten silicide.

Given the discussion thus far, it will also be appreciated that a method for fabricating a power semiconductor device includes: forming at least one LDMOS structure having a first fully silicided gate; and forming at least one CMOS structure integrated with the LDMOS structure on the same substrate, the CMOS structure having a second fully silicided gate separate from the first fully silicided gate.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary circuits illustrated in the accompanying figures, or portions thereof, may be part of an integrated circuit. Integrated circuits so manufactured are considered part of this invention.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having active semiconductor devices integrated with passive components in accordance with one or more embodiments of the invention.

An integrated circuit in accordance with aspects of the present disclosure can be employed in essentially any application and/or electronic system where high-frequency power semiconductor devices (e.g., RF power amplifiers) are employed. Suitable systems and devices for implementing embodiments of the invention may include, but are not limited to, portable electronics (e.g., cell phones, tablet computers, etc.). Systems incorporating such integrated circuits are considered part of this invention. Given the teachings of the present disclosure provided herein, one of ordinary skill in the art will be able to contemplate other implementations and applications of embodiments of the invention.

The illustrations of embodiments of the invention described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of all means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. A power semiconductor device, comprising:
at least one lateral diffused metal-oxide-semiconductor (LDMOS) structure having a first fully silicided gate comprising a first metal silicide material, the LDMOS structure having a silicided source region and an unsilicided lightly-doped drain region;

at least one complementary metal-oxide-semiconductor (CMOS) structure integrated with the LDMOS structure on a same substrate, the CMOS structure having a second fully silicided gate comprising a second metal silicide material, the first and second metal silicide materials being different from one another; and a shielding structure formed over at least a portion of the first gate of the LDMOS structure, the shielding structure being configured to distribute an electric field potential gradient over a lightly-doped drain region of the LDMOS structure and away from a corner of the first gate.

2. The device of claim 1, wherein the first metal silicide material comprises tungsten silicide.

3. The device of claim 2, wherein the second fully silicided gate comprises at least one of titanium silicide ($TiSi_2$), cobalt silicide ($CoSi_2$) and nickel silicide ($NiSi_2$).

4. The device of claim 1, wherein the first fully silicided gate is formed separately from the second fully silicided gate.

5. The device of claim 1, wherein the first fully silicided gate comprises one of tungsten silicide, tantalum silicide, titanium silicide and cobalt silicide, and the second fully silicided gate comprises one of titanium silicide, cobalt silicide and nickel silicide, material used to form the second fully silicided gate having a lower phase transition temperature relative to a phase transition temperature of material used to form the first fully silicided gate.

6. The device of claim 1, wherein the first fully silicided gate of the LDMOS structure is formed prior to formation of the CMOS structure.

7. The device of claim 1, further comprising a plurality of shallow trench isolation (STI) structures formed in the substrate, the STI structures electrically isolating the LDMOS structure from the CMOS structure.

8. The device of claim 1, further comprising a gate oxide layer formed under the first gate of the LDMOS structure and second gate of the CMOS structure, the gate oxide layer under the first gate having a first cross-sectional thickness and the gate oxide layer for the second gate having a second cross-sectional thickness, the first thickness being greater than the second thickness.

9. The device of claim 1, wherein the CMOS structure is a deep submicron CMOS structure having a minimum channel length of less than 0.35 micron.

10. The device of claim 1, further comprising:
dielectric spacers formed on at least sidewalls of the first gate of the LDMOS structure; and
a dielectric layer formed over at least a portion of the first gate and the dielectric spacers, the shielding structure being formed on at least a portion of the dielectric layer.

11. The device of claim 1, wherein the first and second fully silicided gates are formed in different process steps.

12. A method of fabricating a power semiconductor device, the method comprising:
forming at least one lateral diffused metal-oxide-semiconductor (LDMOS) structure having a first fully silicided gate comprising a first metal silicide material, the LDMOS structure being formed with a silicided source region and an unsilicided lightly-doped drain region;
forming at least one complementary metal-oxide-semiconductor (CMOS) structure integrated with the LDMOS structure on a same substrate, the CMOS structure having a second fully silicided gate comprising a second metal silicide material, the at least one CMOS structure being formed after formation of the first fully silicided gate of the at least one LDMOS structure, the first and second metal silicide materials being different from one another;

forming a dielectric layer over the first fully silicided gate of the LDMOS structure; and forming a shielding structure on at least a portion of the dielectric layer, the shielding structure being formed concurrently with a formation of the second fully silicided gate of the CMOS structure, the shielding structure being configured to distribute an electric field potential gradient over the lightly-doped drain region of the LDMOS structure and away from a corner of the first fully silicided gate.

13. The method of claim 12, wherein forming the at least one LDMOS structure comprises:
forming a channel region in the LDMOS structure, the LDMOS channel region being self-aligned with the first fully silicided gate.

14. The method of claim 13, wherein forming the channel region in the LDMOS structure comprises separating a drain contact from the first fully silicided gate with a lightly-doped drain (LDD) region formed between the drain contact and the first fully silicided gate.

15. The method of claim 12, wherein the first fully silicided gate of the LDMOS structure is formed before the second fully silicided gate of the CMOS structure.

16. The method of claim 12, wherein forming the at least one LDMOS structure comprises:
forming a first gate oxide layer in at least a portion of an LDMOS area of the semiconductor device;
forming a first polysilicon layer on at least a portion of the first gate oxide layer;
forming a protection layer over areas of the semiconductor device where the first fully silicided gate of the LDMOS structure is not being formed;
depositing a first metal layer on at least a portion of the first polysilicon layer, the first polysilicon layer and the first metal layer forming a first film stack;
patterning and etching the first film stack to form a first self-aligned gate stack; and
annealing the first self-aligned gate stack at a first temperature to form the first fully silicided gate of the LDMOS structure.

17. The method of claim 16, wherein the first metal layer comprises at least one of tungsten and tungsten silicide.

18. The method of claim 16, wherein forming the at least one CMOS structure comprises:
forming a second gate oxide layer in at least a portion of a CMOS area of the semiconductor device, the second gate oxide layer having a cross-sectional thickness that is different than a cross-sectional thickness of the first gate oxide layer;
forming a second polysilicon layer on at least a portion of the second gate oxide layer;
forming a spacer layer on at least sidewalls of the second polysilicon layer; and
forming a self-aligned silicide layer on the second polysilicon layer, the self-aligned silicide layer and the second polysilicon layer forming the second fully silicided gate of the CMOS structure.

19. The method of claim 18, wherein the self-aligned silicide layer on the second polysilicon layer comprises a second metal layer, the first metal layer being formed of a different material than the second metal layer.

20. The method of claim 19, wherein the first metal layer comprises at least one of tungsten, tantalum, titanium, cobalt and tungsten silicide, and the second metal layer comprises at least one of titanium, cobalt and nickel, material used to form the second metal layer having a lower phase transition temperature relative to a phase transition temperature of material used to form the first metal layer.

21. The method of claim 18, wherein forming the self-aligned silicide layer on the second silicide layer comprises:
depositing a second metal layer on the second polysilicon layer, the second polysilicon layer and the second metal layer forming a second film stack;
patterning and etching the second film stack to form a second self-aligned gate stack; and
annealing the second self-aligned gate stack at a second temperature to form the second fully silicided gate of the CMOS structure.

22. The method of claim 21, wherein the second temperature is less than the first temperature.

23. The method of claim 12, wherein the first fully silicided gate of the LDMOS structure is formed separately from the second fully silicided gate of the CMOS structure.

24. The method of claim 12, wherein forming the at least one CMOS structure comprises:
forming source and drain regions in the CMOS structure; and
siliciding the source and drain regions in the CMOS structure by self-aligning a silicide layer with the corresponding source and drain regions.

25. The method of claim 12, wherein a minimum channel length of a fabrication process used to form the CMOS structure is less than 0.35 micron.

26. The method of claim 12, wherein the second metal silicide material included in the second fully silicided gate of the CMOS structure comprises one of cobalt silicide, titanium silicide and nickel silicide.

27. A power semiconductor device, comprising:
at least one lateral diffused metal-oxide-semiconductor (LDMOS) structure having a first fully silicided gate comprising a first metal silicide material; and
at least one complementary metal-oxide-semiconductor (CMOS) structure integrated with the LDMOS structure on a same substrate, the CMOS structure having a second fully silicided gate comprising a second metal silicide material, the first and second metal silicide materials being different from one another;
wherein the LDMOS structure has a silicided source region comprising the second metal silicide material and an unsilicided lightly-doped drain region.

* * * * *